(12) United States Patent
Aley (10) Patent No.: US 9,213,073 B2
(45) Date of Patent: Dec. 15, 2015

(54) METHOD AND APPARATUS FOR COMPENSATING FOR DRIFT IN MAGNETIC FIELD STRENGTH IN SUPERCONDUCTING MAGNETS

(71) Applicant: Nicholas Paul Aley, Witney (GB)

(72) Inventor: Nicholas Paul Aley, Witney (GB)

(73) Assignee: Siemens PLC, Camberley (GB)

( * ) Notice: Subject to any disclaimer, the term of this patent is extended or adjusted under 35 U.S.C. 154(b) by 115 days.

(21) Appl. No.: 14/185,273

(22) Filed: Feb. 20, 2014

(65) Prior Publication Data

US 2014/0235448 A1    Aug. 21, 2014

(30) Foreign Application Priority Data

Feb. 20, 2013  (GB) .................................. 1302979.8

(51) Int. Cl.
| | |
|---|---|
| *G01R 33/387* | (2006.01) |
| *G01R 33/389* | (2006.01) |
| G01R 33/3815 | (2006.01) |
| H01F 6/06 | (2006.01) |

(52) U.S. Cl.
CPC ............ *G01R 33/387* (2013.01); *G01R 33/389* (2013.01); *G01R 33/3815* (2013.01); *H01F 6/06* (2013.01)

(58) Field of Classification Search
CPC ........... G01R 33/0358; G01R 33/0352; H01L 39/225; H01L 39/2496
See application file for complete search history.

(56) References Cited

U.S. PATENT DOCUMENTS

| | | | |
|---|---|---|---|
| 5,351,006 A | 9/1994 | Sumanaweera et al. | |
| 6,529,005 B1* | 3/2003 | Kasten et al. ................. | 324/320 |
| 2001/0025191 A1* | 9/2001 | Montgomery ................ | 607/104 |
| 2003/0137299 A1* | 7/2003 | Ham et al. .................... | 324/313 |
| 2005/0077899 A1 | 4/2005 | Jacobs | |
| 2009/0123139 A1 | 5/2009 | Seeber et al. | |
| 2009/0128269 A1 | 5/2009 | Seeber et al. | |

(Continued)

FOREIGN PATENT DOCUMENTS

| | | |
|---|---|---|
| CA | 2 407 145 A1 | 6/2003 |
| GB | 2 354 328 A | 3/2001 |

(Continued)

OTHER PUBLICATIONS

Inoue et al., "Magnetic Properties of Single Crystalline FeRh Alloy Thin Films," IEEE Transactions on Magnetics, vol. 44, No. 11, (2008) pp. 2875-2878.

(Continued)

*Primary Examiner* — Colleen Dunn
(74) *Attorney, Agent, or Firm* — Schiff Hardin LLP (57) ABSTRACT

An MRI system has a cylindrical superconducting magnet assembly contained in a bore tube of a cylindrical vacuum vessel (OVC), and a gradient coil assembly situated within the OVC bore tube. In an imaging region within a bore of the gradient coil assembly, the magnet assembly produces a magnetic field that is subject to drift during operation of the MRI system. Compensating material is located at a radial position between the imaging region and the magnet in a location that will be heated over a range of temperatures during operation of the MRI system. The compensating material is adjustable between two magnetic phases in response to an applied physical characteristic, which is selectively applied thereto so as to change the compensating material from a first magnetization to a second magnetization, and thereby compensate the drift.

51 Claims, 3 Drawing Sheets

(56) References Cited

U.S. PATENT DOCUMENTS

2009/0206839 A1  8/2009  Seeber et al.
2009/0237076 A1*  9/2009  Ham ............................ 324/307
2011/0037467 A1  2/2011  Tsuda

FOREIGN PATENT DOCUMENTS

| WO | WO-96/00400 | 1/1996 |
| WO | WO-00/54069 | 9/2000 |
| WO | WO-2006/064430 A1 | 6/2006 |

OTHER PUBLICATIONS

Patent Abstract for RD442032-A Compensation for Thermal Drift in Magnetic Resonance (MR) Shimming, (2001).

* cited by examiner

METHOD AND APPARATUS FOR COMPENSATING FOR DRIFT IN MAGNETIC FIELD STRENGTH IN SUPERCONDUCTING MAGNETS

BACKGROUND OF THE INVENTION

1. Field of the Invention

The present invention relates to a method and apparatus to compensate for drift in magnetic field strength in superconducting magnets, particularly drift caused by thermal variation of magnetic properties.

2. Description of the Prior Art

Figure 1:
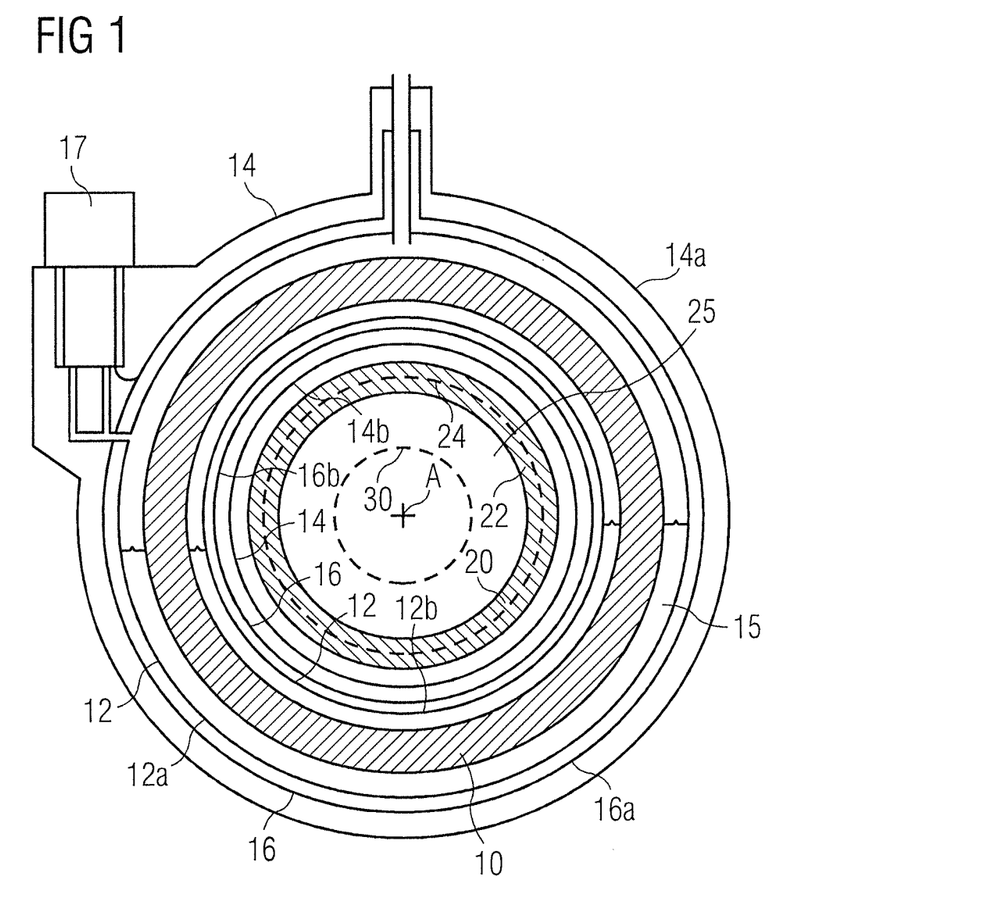
FIG. 1 illustrates a schematic cross-section through a typical superconducting magnet structure used in an MRI system.

FIG. 1 illustrates a schematic radial cross-section through a typical superconducting magnet structure used in an MRI system, such as may be improved by the present invention. A cylindrical magnet 10, typically having superconducting coils mounted on a former or other mechanical support structure, is positioned within a cryostat, has a cryogen vessel 12 that contains a quantity of liquid cryogen 15, for example helium, which holds the superconducting magnet at a temperature below its transition temperature. The magnet is essentially rotationally symmetrical about axis A-A. The term "axial" is used in the present document to indicate a direction parallel to axis A-A, while the term "radial" means a direction perpendicular to axis A-A, in a plane which passes through the axis A-A.

The cryogen vessel 12 is itself cylindrical, having an outer cylindrical wall 12a, an inner cylindrical bore tube 12b, and substantially planar annular end caps (not visible in FIG. 1). An outer vessel 14 surrounds the cryogen vessel. It is commonly referred to as Outer Vacuum Chamber (OVC), and will be referred to herein as OVC. The OVC 14 is also cylindrical, having an outer cylindrical wall 14a, an inner cylindrical bore tube 14b, and substantially planar annular end caps (not visible in FIG. 1). A hard vacuum is provided in the volume between the OVC 14 and the cryogen vessel 12, providing effective thermal insulation. A thermal radiation shield. 16 is placed in the evacuated volume. This is typically not a fully closed vessel, but is essentially cylindrical, having an outer cylindrical wall 16a, an inner cylindrical bore tube 16b, and substantially planar annular end caps (not visible in FIG. 1). The thermal radiation shield 16 serves to intercept radiated heat from the OVC 14 before it reaches the cryogen vessel 12. The thermal radiation shield 16 is cooled, for example by an active cryogenic refrigerator 17, or by escaping cryogen vapour.

In alternative arrangements, the magnet is not housed within a cryogen vessel, but is cooled in some other way: either by a low cryogen inventory arrangement such as a cooling loop, or a 'dry' arrangement in which a cryogenic refrigerator is thermally linked to the magnet. In 'dry' configurations, heat loads on the magnet are not directly cooled by liquid cryogens but, instead, are removed via a thermal link connected to a cooling pipe or refrigerator. Such heat-loads can result, for instance, from current ramping or gradient coil operation. The OVC is however still present.

The OVC bore tube 14b must be mechanically strong and vacuum tight, to withstand vacuum loading both radially and axially. Conventionally, it is made of stainless steel. The cryogen vessel bore tube 12b, if any, must be strong and capable of withstanding the pressure of cryogen gas within the cryogen vessel. Typically, this is also of stainless steel. The bore tube 16b of the thermal radiation shield 16 must be impervious to infra-red radiation. It is preferably lightweight and a good conductor of heat. It is typically made of aluminium.

In order to provide an imaging capability, a set of gradient coils 20 (not visible in FIG. 1) are provided within a gradient coil assembly 22 mounted within the OVC bore 14b. A gradient coil assembly 22 usually comprises a hollow cylindrical, resin-impregnated block, containing coils which generate orthogonal oscillating magnetic field gradients in three dimensions. A patient bore 25, located within the gradient coil assembly 22, is an open volume into which a patient is placed for imaging. A shimming arrangement is typically provided within the gradient coil assembly 22, where passive iron shims are placed in selected locations to improve the homogeneity of the background field $B_0$ in the imaging region. Typically, the shims are placed in trays (not shown) which are, in turn, placed within shim slots 24.

During an imaging procedure, the gradient coils 20 generate rapidly oscillating magnetic fields with very fast risetimes of typically just a few milliseconds. Stray fields from the gradient coils generate eddy currents in metal parts of the cryostat, in particular in metal bore tubes 14b, 16b, 12b of OVC, thermal shield and cryogen vessel. These eddy currents cause ohmic heating of the OVC bore tube. Mechanical vibration of the gradient coil assembly causes vibration of the OVC bore tube 14b. As this vibration takes place within the magnetic field of the superconducting magnet 10, further currents are induced in the material of the OVC bore tube, causing further heating. The gradient coils themselves are made of resistive wire, typically copper, and heat significantly in use.

These factors combine to produce an appreciable heating of the OVC bore tube. Cryogen vessel 12 and thermal radiation shield 16 are cooled by liquid cryogen 15, where used, and refrigerator 17. They do not heat appreciably when the magnet is in use.

The superconducting magnet 10 operates in persistent mode and generates a constant magnetic field, which may be referred to as the "background field" $B_0$.

An imaging region 30 is provided, typically near the radial and axial centre of the patient bore 25. Great care is taken to ensure that the background field $B_0$ is homogeneous and constant throughout the volume of the imaging region. This is typically designed and achieved to within a few parts per million.

However, some temporal drift in both the homogeneity and field strength of the background field $B_0$ is observed with time, when the MRI system is in use. This has been attributed to changes of magnetic properties of the material of the OVC bore tube 14b with varying temperature. The heating of the OVC and shims will cause higher order drifts leading to reduced homogeneity.

When the MRI system is in use, the OVC bore tube 14b is heated by conduction and radiation from the gradient coil assembly, and is heated by eddy currents caused by mechanical oscillation of the OVC bore tube, itself caused by interaction with time varying magnetic fields generated by the gradient coil assembly, as explained above.

SUMMARY OF THE INVENTION

The present invention accordingly provides methods and apparatus for compensating for such variation in magnetic properties of the materials of the bore tubes.

The above object is achieved in accordance with the present invention in an MRI system that has a cylindrical superconducting magnet assembly, a cylindrical vacuum vessel (OVC) that has a bore tube and that contains the superconducting magnet assembly, the OVC bore tube being rotationally symmetrical about the longitudinal axis of the OVC, a gradient coil assembly situated within the OVC bore tube, and an imaging region within a bore of the gradient coil assembly, in which the magnet assembly produces a magnetic field that is subject to drift during operation of the MRI system. Compensating material is located at a radial position between the imaging region and the magnet in a location that will be heated over a range of temperatures during operation of the MRI system. The compensating material is adjustable between two magnetic phases in response to applied physical characteristic. An adjustment device selectively applies the physical characteristic so as to change the compensating material from a first magnetization to a second magnetization, and thereby compensate the drift.

The above object also is achieved in accordance with the invention by a method for operating an MRI system that has a cylindrical superconducting magnet assembly, a cylindrical vacuum vessel (OVC) that has a bore tube and that contains the superconducting magnet assembly, the OVC bore tube being rotationally symmetrical about the longitudinal axis of the OVC, a gradient coil assembly situated within the OVC bore tube, and an imaging region within a bore of the gradient coil assembly, in which the magnet assembly produces a magnetic field that is subject to drift during operation of the MRI system. The method according to the invention includes the step of situating compensating material at a radial position between the imaging region and the magnet in a location that will be heated over a range of temperatures during operation of the MRI system. The compensating material is adjustable between two magnetic phases in response to applied physical characteristic. The method according to the invention includes the step of selectively applying the physical characteristic so as to change the compensating material from a first magnetization to a second magnetization, and thereby compensating the drift.

DESCRIPTION OF THE PREFERRED EMBODIMENTS

It has been found that a significant proportion of the observed variation in background field variation ("drift") $\Delta B_0$ is caused by the effect of heating the OVC bore tube 14b. This in turn is believed to be attributable to a change of the magnetic characteristics of the material of the OVC bore tube 14b due to changes in its temperature. The proportion of the $B_0$ drift attributed to the changes in magnetic properties of the material of the OVC bore tube will depend on a number of factors. The proportion will scale with the strength of the applied field $B_0$. It will vary with the temperature rise of the bore tube compared to the temperature rise of the shims. It will vary with the volume/mass of OVC that is heated, and the distribution of shim iron. However, the contribution of background field variation ("drift") $\Delta B_0$ which is caused by the effect of heating the OVC bore tube 14b will dominate as the $B_0$ field increases.

Typically, the OVC bore tube 14b is made of stainless steel. Stainless steel is antiferromagnetic with an ordering (Néel) temperature of about 40K.

The susceptibility increases with temperature up till the ordering (Néel) temperature. Above that temperature the susceptibility follows a 1/T relationship.

Stainless steel has paramagnetic susceptibility due to the composition of the material itself, and also has a lesser ferromagnetic susceptibility, due to ferromagnetic phases induced by the mechanical cold working which the OVC has undergone in fabrication.

The paramagnetic susceptibility of stainless steel follows a Curie-Weiss Law:

$$\chi \propto \frac{1}{T - T_c}$$

The reduction in magnetization of the OVC bore tube with increasing temperature leads to a rise in $B_0$, temperature dependent drift.

It has been found that the change in magnetic properties of the OVC is essentially due to thermal variation of the paramagnetic susceptibility. The ferromagnetic phases will also cause variation on the magnetic properties of the OVC bore tube, but this has been found to be of much less significance, as can be appreciated from consideration of FIG. 2.

Figure 2:
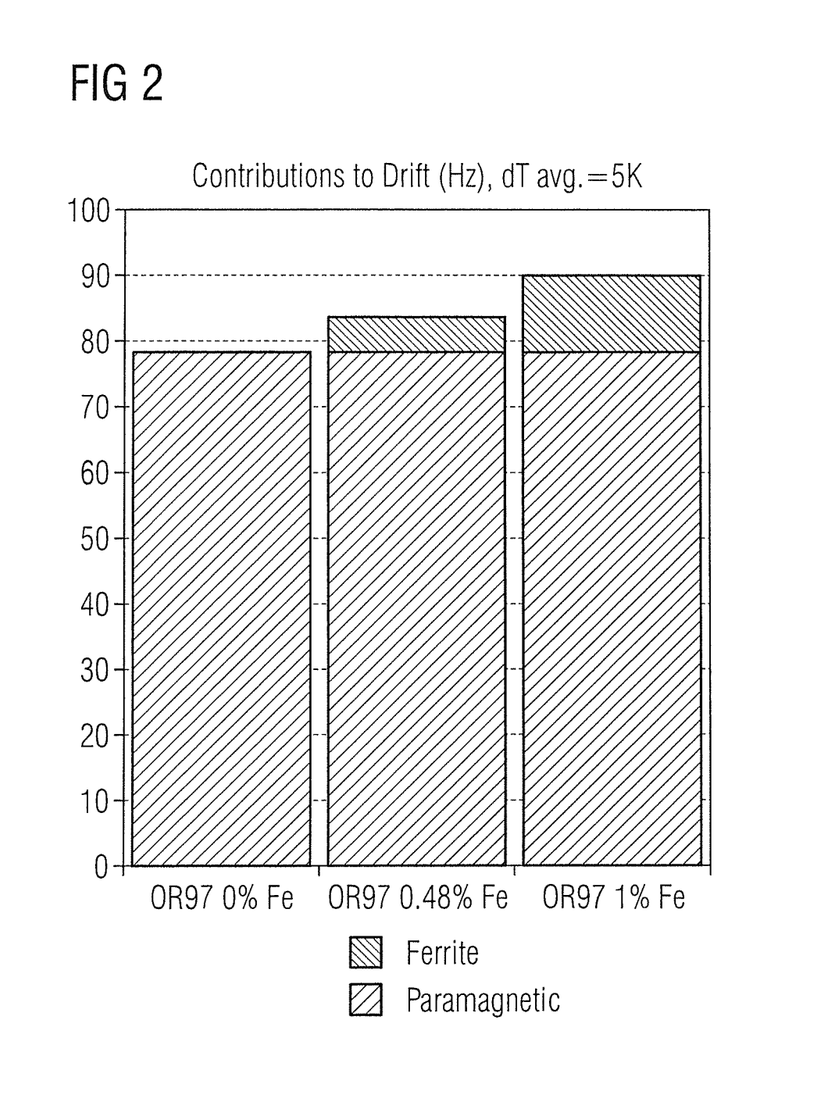
FIG. 2 shows calculated contributions to drift in background magnetic field $B_0$ due to variation in magnetic properties in OVC bore tubes of three different compositions over a temperature variation of 5K.

FIG. 2 shows calculated contributions to drift in background magnetic field $B_0$ due to variation in magnetic properties in OVC bore tubes of three different compositions over a temperature variation of 5K. The first composition has no ferromagnetic phase; the second composition has a ferromagnetic phase which accounts for 0.48% of the drift in background magnetic field $B_0$; and the third composition has a ferromagnetic phase which accounts for 1% of the drift in background magnetic field $B_0$. As can be clearly seen from this graph, the greatest scope for reduction in drift in background magnetic field $B_0$ can be addressed by compensating for drift in the paramagnetic susceptibility of the material of the OVC bore tube 14b.

The magnetization of the stainless steel will increase approximately linearly with field in the region of interest. The susceptibility of stainless steel varies with temperature, which is the cause of the $B_0$ drift.

Other materials such as aluminum or copper do not suffer from such temperature-dependent susceptibility, but are not commonly used for OVC bore tubes, due to a combination of higher electrical conductivity and higher cost, and lower load-bearing capability than stainless steel.

Choice of an appropriate grade of stainless steel for the OVC bore tube would remove the ferromagnetic element of the $B_0$ drift. Examples are a 304LN stainless steel, such as used for making helium vessels, or 310 or 904L stainless steels which produce negligible ferromagnetic phases on cold working. However, as illustrated in FIG. 2, this can only address a relatively small part of the $B_0$ drift. The present invention seeks a reduction in the $B_0$ drift caused by variation in paramagnetic susceptibility of the material of the OVC bore tube 14b.

The $B_0$ drift $\Delta B_0$ is largely caused by reduced alignment of magnetic domains causing change in magnetic susceptibility $\Delta \chi$ with changing temperature $\Delta T$. The $B_0$ drift $\Delta B_0$ caused by the paramagnetic component of magnetic susceptibility of the stainless steel is proportional to the magnetic field H and the volume V of material:

$$\frac{\Delta B_0}{\Delta T} \propto V \cdot H \cdot \frac{\Delta \chi}{\Delta T}.$$

While the temperature dependence of the susceptibility of the material of the OVC bore tube 14b was not found to be a particular problem for superconducting magnets having a background field strength of about 1.5 T, more recent MRI systems include superconducting magnets producing background field strength $B_0$ of 3 T or more, and the temperature dependent susceptibility of the OVC bore tube has become a significant factor in observed $B_0$ field drift. The rise in magnetic moment of stainless steel is linear with magnetic field.

According to the present invention, compensating material is added. The compensating material used is a phase-change material, that is to say that its magnetic properties may be switched form one phase of magnetism to another by control of a certain physical parameter. Typically, that controlled physical parameter is temperature. A different class of materials, multiferroic materials, may change magnetic properties in response to variation in other physical parameters, such as electric field strength, mechanical strain. Such phase-change materials include FeRh (iron-rhodium). These materials exhibit a magnetic phase-change from antiferromagnetic to ferromagnetic at a certain transition temperature.

Figure 3:
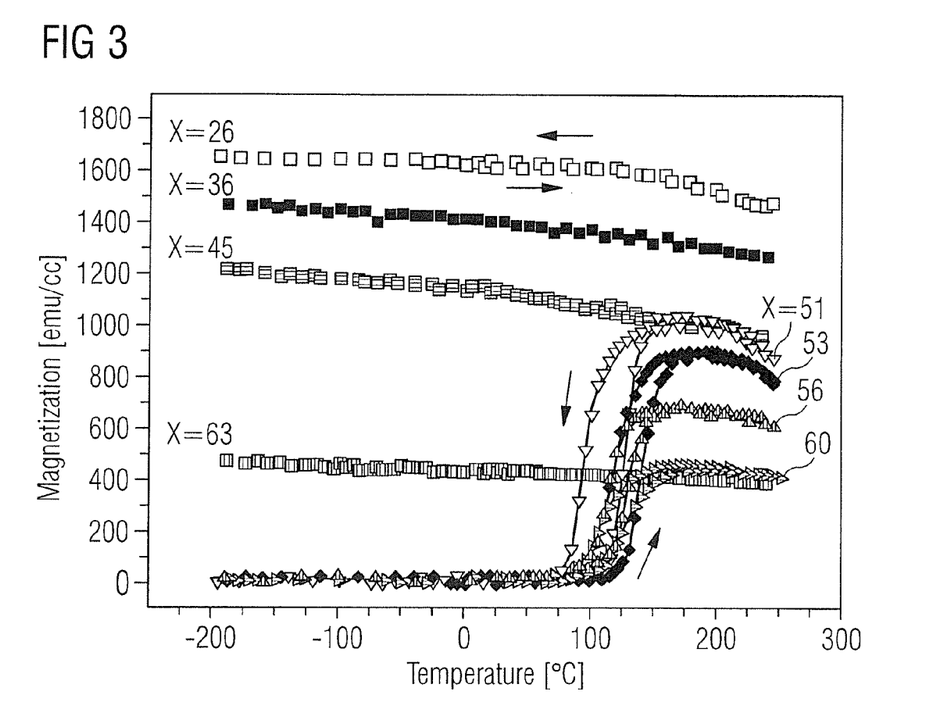
FIG. 3 illustrates temperature dependence of magnetization of FeRh thin film in the composition range 26-63 under the magnetic fields of 15 kOe.

Antiferromagnets have a small but positive susceptibility, and they do not exhibit ferromagnetic properties such as hysteresis. A typical temperature dependence of antiferromagnets is shown in FIG. 3, which shows temperature dependence magnetization of FeRh thin film in the composition range 26-63 under the magnetic fields of 15 kOe [S. Inoue et al IEEE TRANSACTIONS ON MAGNETICS, VOL. 44, NO. 11, NOVEMBER 2008].

Materials such as iron-rhodium $Fe_{(100-x)}Rh_x$ where $51 \leq x \leq 60$, magnesium bismuth MgBi, exhibit a magnetic phase change with increasing temperature.

Iron-rhodium has a large magnetic moment, and so is preferred, but expensive. Magnesium-bismuth is less expensive, but has a lower phase transition temperature which may prove impractical.

According to an aspect of the present invention, one or more magnetic phase-change compensating material(s) is/are positioned radially between the superconducting magnet and the imaging region and an appropriate physical parameter is varied to change the magnetic phase and/or magnetization of some or all of the compensating material(s) to compensate for $B_0$ drift caused by heating of parts of the magnet system, such as the OVC bore tube 14b.

In this way, thermal variation in the magnetic properties of the OVC bore tube 14b is compensated for by an opposing, complementary variation in magnetic properties in the added controlled phase-change compensating material(s).

Selected compensating material may be positioned at selected locations, radially between the superconducting magnet and the imaging region. Control means are provided to vary a selected physical parameter, typically temperature, which causes the compensating material to switch from a first magnetic phase to a second magnetic phase.

In certain embodiments of the present invention, a control system calculates or detects drift in $B_0$ and operates the control means to change the magnetic phase of the compensating material in all, or selected, regions.

Typically, the susceptibility of the phase-change compensating material changes, with increasing temperature, in an opposite direction to the change in susceptibility of the material of the OVC bore tube 14b, such that variation in $B_0$ caused by the change in susceptibility of the material of the bore tube with increasing temperature is compensated by the change in susceptibility of the controlled phase-change compensating material.

The change in temperature of the OVC bore tube in use may be expected to be around 5K. That may be insufficient to cause a phase-change in known phase-change materials. The present invention accordingly provides a controlled heating arrangement, to subject the phase-change material to a greater change in temperature than would otherwise be the case for the OVC bore tube, so as to bring about a change in susceptance of the phase-change compensating material in an opposite direction to a change in susceptance of the material of the OVC bore tube, thereby to reduce a $B_0$ drift.

The material may be applied as a coating on a solid plate, preferably of non-magnetic material, and this solid plate may be attached to an appropriate place radially between the superconducting magnet and the imaging region. For example, a non-magnetic plate coated with phase-change material can be placed inside a conventional shim tray. In all cases, however, means must be provided for varying the appropriate physical parameter of the phase-change compensating material. Typically, the physical parameter is temperature, and so only temperature is discussed in this description, although the invention extends to materials which change phase in response to the variation of other physical parameters.

In the case of a nonmagnetic plate coated with a phase-change compensating material, this may be conveniently achieved by coating one side of the plate with phase-change compensating material and attaching an electrical heater to the other side of the plate. Wires must be run from each heater to a source of electrical power, through a switching means which is controlled by a controller.

In certain embodiments of the invention, the phase-change compensating material is provided as a powder mixed into a carrier, which is applied as a coating onto an outer or inner surface of the OVC, or an outer or inner surface of the gradient coil assembly 22. In each case, controlled heating arrangements must be provided to enable control of the temperature, and hence the magnetic phase of the compensating material.

In a variant of such embodiments, the phase-change compensating material is coated onto a flexible backing, and an electrical heater may be placed on the other side of the backing, or embedded within the backing. A self-adhesive coating may be provided on one or other sides of the assembly, providing a self-adhesive patch of phase-change compensating material which is easy to apply. Taking care to avoid damaging the electrical heater and associated wires, such patches may be cut to size before application.

In alternative arrangements, the phase-change material may be coated onto a surface of shim trays. One or more suitable electric heaters may be embedded in the material of the shim trays. Electric wires must be provided from each heater to a source of electrical power, through a switching means which is controlled by a controller.

While intended to compensate for a change in the magnetic susceptibility of the OVC bore tube, the phase-change compensating material of the present invention may be arranged and controlled to compensate for other causes of $B_0$ drift as well, for example, $B_0$ drift caused by temperature rise in the material of ferromagnetic shims in the gradient coil assembly.

Examples of suitable phase-change materials are given below:

1) iron-rhodium $Fe_{(100-x)}Rh_x$ where $51 \leq x \leq 60$, changes from antiferromagnetic at room temperature to ferromagnetic at temperatures in excess of about 380K; and 2) manganese bismuth MnBi, changes from ferromagnetic to antiferromagnetic with increasing temperature.

In alternative embodiments, multiferroic materials may be used. Such materials change magnetic direction in response to an applied electric field or mechanical stress. In embodiments of the present invention, a layer of such material can be placed between electrode surfaces. By applying a voltage difference between the electrode surfaces, the direction of magnetization of the layer can be controlled. By arranging various independently controlled electrodes, various sections of a single layer of multiferroic compensating material may be controlled independently.

Generally, phase-change compensating materials are preferred in which the phase-change occurs between one phase with large magnetic moment and another phase with small magnetic moment. A significant change in magnetic moment is required to enable effective compensation to be obtained with a reasonable amount of compensating material. The controlled phase-change should preferably be as abrupt as possible with changing applied physical conditions. Any physical condition may be used, as appropriate for the chosen compensating material, provided that it does not interfere with the homogeneity of the magnetic field $B_0$. Example conditions include temperature, electric field, stress.

FeRh is believed to be suitable for compensating the $B_0$ drift of a stainless steel OVC bore tube, and also for compensating a mild steel OVC bore tube. Ordered FeRh alloy exhibits an antiferromagnetic-to-ferromagnetic phase shift at temperatures between 343 K–423 K. The precise transition temperature is dependent on the alloy composition. The transition temperature has been shown to reduce in higher strength magnetic fields. FeRh thin films have a magnetization in the range $0.5$–$1.0 \times 10^6$ A·m$^{-1}$.

Control arrangements employed by the present invention may include a detector of $B_0$ drift, which controls the temperature, or other selected physical characteristic of the phase-change compensating material, in dependence upon the detected $B_0$ drift to compensate appropriately. Alternatively, means may be provided for detecting a rise in temperature and controlling the temperature, or other selected physical characteristic of the phase-change compensating material, in dependence upon the detected temperature rise to compensate appropriately.

Alternatively, the phase-change compensating material may be operated with a simple on-off control, activated in response to parameters such as a threshold value of $B_0$ drift, a certain OVC bore tube temperature, or after a certain time of operation of the gradient coils, such that all of the phase-change compensating material is switched from the first state to the second state by adjustment of the appropriate physical characteristic.

A more detailed example of an actively controlled arrangement for compensating for $B_0$ drift by temperature control of a FeRh thin film will now be discussed.

In an example known system with a stainless steel OVC bore tube, the change in magnetic moment due to the heating of the bore tube has been estimated at about 1.7 A·m$^2$. To compensate this using FeRh film which has a magnetization of about $0.5$-$1.0$ A·m$^2$ per cubic centimeter, the volume of FeRh required in the film would be about 1.7-3.4 cm$^3$. This relatively small volume of material would need to be distributed evenly, or at least in a regular distribution, around the imaging volume.

Figure 4:
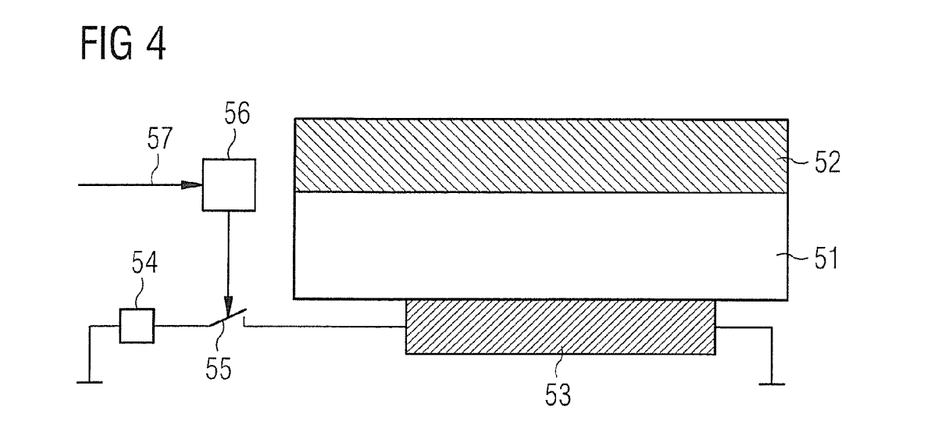
FIG. 4 shows a schematic illustration of a $B_0$ drift compensation device using a temperature controlled magnetic phase-change material according to an aspect of the present invention.

FIG. 4 shows a schematic illustration of a controlled $B_0$ drift compensation device according to an aspect of the present invention using a temperature controlled magnetic phase-change material such as FeRh. A substrate 51 of thermally conductive but non-magnetic material, such as aluminium or copper, is coated on one side with a film 52 of phase-change compensating material, such as FeRh. This may be achieved by vapour deposition of a crystalline layer, or by application of a coating which includes powdered material in a carrier such as an epoxy resin. On the opposite side of the substrate is placed an electrical heater 53, which is preferably electrically insulated from the substrate 51 if the substrate is electrically conductive. The heater 53 is connected to a source of electric power 54 through a switching arrangement 55, which may be manually operated but which is preferably operated by a controller 56 in response to an appropriate trigger event 57, such as a detected change in $B_0$, or a detected change in temperature of the OVC bore tube or gradient coil assembly, or a certain time period of operation of the gradient coils.

In alternative arrangements, the electrical heater 53 may be replaced by an alternative heating arrangement, such as thermal connection to a heated water- or oil-filled pipe.

In certain embodiments, the compensating material may be applied as a coating onto a surface of the shim trays, or be embedded as a powder in the material of the shim trays. Alternatively, sheets of non-magnetic material containing powdered compensating material may be applied to surfaces of the shim trays.

The shim trays may be heated by electrical heaters, or the passage of heated fluid through the shim slots 24, or through conduits in thermal contact with the shim trays. In a particularly preferred embodiment, the substrate 51 is the size of an iron shim as used in a shim tray of the MRI system in question. The $B_0$ drift compensation devices may then be placed in selected positions in selected shim pockets in the gradient coil assembly, and appropriate connections made to allow activation of the heating arrangements, such as electric heaters 53. This provides a simple way of installing a $B_0$ drift compensation arrangement of the present invention, which may easily be retrofitted to existing MRI systems.

In alternative embodiments using a multiferroic material, a similar arrangement could be employed, where a stress-inducing means, such as a piezo-electric element, or electrodes to generate an electric field, are used instead of heater 53.

In some MRI systems, shim trays are positioned on a radially outer surface of the gradient coil assembly. In such arrangements, the compensating material of the present invention and the associated heating arrangements may be positioned on the outer surface of the gradient coil assembly, between the shim trays.

Alternatively, the compensating material may be applied as patches over a surface of the OVC or gradient coil assembly, with associated heating arrangements. This could be achieved by screen printing or stencilling of a paint containing the compensating material, or application of sheets of non-magnetic material containing compensating material, such as sheets of polyester with embedded FeRh powder. This may be conveniently supplied and applied as a self-adhesive sheet which may be cut to size before application to a chosen part of the surface of the OVC or gradient coil assembly.

In further embodiment, a complete cylinder of non-magnetic material may be produced with embedded or coated-on phase-change compensating material with associated heating arrangements, the cylinder being slid over the gradient coil assembly during production. Alternatively, the cylinder may be dimensioned to fit inside the gradient coil assembly as a liner. Similarly, such cylinders may be arranged to fit the radially outer surface of the OVC bore tube and be positioned during assembly of the OVC, or may be dimensioned to fit inside the OVC bore tube as a liner.

In embodiments using a paint, coating or compensating material embedded in a nonmagnetic carrier, care should be taken to ensure an even distribution of compensating material. For materials such as FeRh, which have a high variation in magnetic moment, the concentration of the compensating material in the resin, paint or the nonmagnetic carrier may be relatively dilute, so that extra care should be taken to ensure an even distribution of the compensating material.

The present invention accordingly provides methods and apparatus for $B_0$ drift compensation which does not reduce the size of the bore available for the imaging region, does not require a change in material of the OVC bore tube and does not require provision of a cooling system for the OVC bore tube. The $B_0$ compensation arrangements of the present invention may be employed to compensate for drift caused by change in magnetic susceptance of the OVC bore tube, and also for $B_0$ drift caused by change in magnetic susceptance of iron shims.

The compensating material added according to the present invention may also compensate for drift in magnetic field strength due to change in magnetic properties of other parts of the magnet structure, not only the OVC bore tube. Nevertheless, the variation of temperature of the OVC bore tube 14*b* is the principle cause of $B_0$ drift addressed by the present invention.

Advantageously, the $B_0$ drift compensation provided by the present invention does not require a change in the original material used for the OVC bore tube, and does not require the provision and operation of a cooling arrangement for the OVC bore tube.

While certain compensating materials have been suggested, by way of examples only, those skilled in the art will be able to determine other compensating materials which may be used in embodiments of the present invention.

Preferably, a material is used which undergoes a positive change in magnetic susceptibility with rising temperature to compensate a falling magnetic susceptibility of stainless steel as it heats.

The present invention is particularly applicable to stainless steel OVC bore tubes, as other materials which may be used, such as aluminium or titanium, undergo only a small change in susceptibility in the temperature range of interest. Mild steel may be used as a material for an OVC bore tube.

The compensating material chosen should have a large enough change in magnetic moment to achieve the required compensation with a reasonable quantity of material.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance imaging (MRI) system comprising:
   a cylindrical superconducting magnet assembly having a longitudinal axis;
   a cylindrical vacuum vessel (OVC) having a bore tube therein, that contains the superconducting magnet assembly, said OVC having a bore tube therein that is rotationally symmetrical about the longitudinal axis;
   a gradient coil assembly situated within the bore tube of the OVC, said gradient coil assembly having a coil assembly bore therein;
   said superconducting magnet assembly being configured to produce a magnetic field in an imaging region within said bore tube of said gradient coil assembly, said magnetic field in said imaging region exhibiting a field property that is subject to drift due to heating that occurs during operation of said MRI system;
   compensating material situated at a radial position, relative to said longitudinal axis, between the imaging region and the superconducting magnet assembly at a location that is subject to heating over a range of temperatures due to said heating that occurs during said operation of the MRI system;
   said compensating material being adjustable between two magnetic phases thereof in response to an applied physical characteristic; and
   an adjustment device configured to selectively apply the physical characteristic to the compensation material so as to change the compensating material from a first magnetization to a second magnetization, and thereby compensate said drift.

2. An MRI system as claimed in claim 1 wherein said physical characteristic is temperature.

3. An MRI system as claimed in claim 2 wherein said adjustment device comprises a controllable heater configured to heat said compensating material.

4. An MRI system as claimed in claim 3 comprising shim material housed within said gradient coil assembly, and wherein said compensating material is situated in thermal contact with said shim material, and wherein said controllable heater comprises an electrical heating arrangement configured to heat the shim material and the compensating material.

5. An MRI system as claimed in claim 3 comprising shim material housed in shim slots within said gradient coil assembly, and wherein said compensating material is situated within said shim slots, and wherein said controllable heater is configured to pass heated fluid through said shim slots.

6. An MRI system as claimed in claim 3 comprising shim material housed in shim slots within said gradient coil assembly, and wherein said compensating material is situated within said shim slots, and wherein said heater is configured to pass heated fluid through conduits in thermal contact with the shim material and the compensating material.

7. An MRI system as claimed in claim 3 comprising shim material contained in shim trays housed within said gradient coil assembly, and wherein said compensating material is comprised in a coating on at least one surface of at least one of said shim trays, and wherein said controllable heater is configured to heat said coating.

8. An MRI system as claimed in claim 7 wherein said coating comprises said compensating material as a powder in an epoxy resin carrier.

9. An MRI system as claimed in claim 3 comprising shim material contained in shim trays situated within respective shim slots in said gradient coil assembly, and wherein said compensating material is embedded as a powder within material forming said shim trays, and wherein said heater is configured to heat said compensating material embedded within said material of said shim trays.

10. An MRI system as claimed in claim 1 comprising shim material contained in shim trays positioned within shim slots in said gradient coil assembly, and wherein said compensating material is formed as at least one patch situated on a surface selected from the group consisting of a surface of the OVC, a surface of at least one of said shim trays, and a surface of said gradient coil assembly.

11. An MRI system as claimed in claim 10 wherein said at least one patch comprises a self-adhesive sheet applied to said surface.

12. An MRI system as claimed in claim 1 wherein said bore tube of said OVC is comprised of stainless steel.

13. An MRI system as claimed in claim 1 wherein said compensating material comprises iron-rhodium having a composition $Fe_{(100-x)}Rh_x$, wherein $51 \leq x \leq 60$.

14. An MRI system as claimed in claim 1 wherein said compensating material comprises magnesium bismuth MgBi.

15. An MRI system as claimed in claim 1 wherein said compensating material comprises at least one metal monoxide.

16. An MRI system as claimed in claim 1 wherein said compensating material is formed as selected masses of said compensating material situated at the bore tube of the OVC at selected locations.

17. An MRI system as claimed in claim 1 wherein said compensating material is comprised in a coating on a radially outer surface of the bore tube of the OVC.

18. An MRI system as claimed in claim 1 wherein said compensating material is comprised in a coating on a radially inner surface of the bore tube of the OVC.

19. An MRI system as claimed in claim 1 wherein said compensating material is comprised in a coating on a radially outer surface of the gradient coil assembly.

20. An MRI system as claimed in claim 1 wherein said compensating material is comprised in a coating on a radially inner surface of the gradient coil assembly.

21. An MRI system as claimed in claim 1 wherein said compensating material is comprised in a coating on a surface of at least one of said bore tube of said OVC and said gradient coil assembly, said coating comprising said compensating material as a powder in an epoxy resin carrier.

22. An MRI system as claimed in claim 1 comprising a complete cylinder of non-magnetic material situated around said gradient coil assembly, said cylinder of non-magnetic material comprising said compensating material embedded therein.

23. An MRI system as claimed in claim 1 comprising a complete cylinder of non-magnetic material situated inside said bore of said gradient coil assembly as a liner, and wherein said cylinder of non-magnetic material comprises said compensating material embedded therein.

24. An MRI system as claimed in claim 1 comprising a complete cylinder of non-magnetic material situated around said bore tube of said OVC, said cylinder of non-magnetic material comprising said compensating material embedded therein.

25. An MRI system as claimed in claim 1 comprising a complete cylinder of non-magnetic material situated inside said bore tube of said OVC, said cylinder of non-magnetic material comprising said compensating material embedded therein.

26. An MRI system as claimed in claim 1 wherein said physical characteristic is temperature, and comprising shim material contained in shim trays positioned within shim slots in said gradient coil assembly, said shim material being formed as sheets, and wherein said MRI system comprises sheets of non-magnetic material coated or embedded with said compensating material, said sheets of non-magnetic material conforming to said sheets of shim material and being situated in said shim trays together with said shim material, and wherein said adjustment device comprises a heater configured to heat said sheets of non-magnetic material.

27. An MRI system as claimed in claim 1 wherein said bore tube of said OVC is comprised of mild steel.

28. A method for operating an MRI system comprising a cylindrical superconducting magnet assembly having a longitudinal axis, a cylindrical vacuum vessel (OVC) that contains the superconducting magnet assembly, said OVC having a bore tube therein that is rotationally symmetrical about the longitudinal axis, a gradient coil assembly situated within the bore tube of the OVC, said gradient coil assembly having a coil assembly bore therein, said superconducting magnet assembly being configured to produce a magnetic field in an imaging region within said bore tube of said gradient coil assembly, said magnetic field in said imaging region exhibiting a field property that is subject to drift due to heating that occurs during operation of said MRI system, said method comprising:

situating compensating material at a radial position, relative to said longitudinal axis, between the imaging region and the superconducting magnet assembly at a location that is subject to heating over a range of temperatures due to said heating that occurs during said operation of the MRI system, said compensating material being adjustable between two magnetic phases thereof in response to an applied physical characteristic; and selectively applying the physical characteristic to the compensation material so as to change the compensating material from a first magnetization to a second magnetization, and thereby compensate said drift.

29. A method as claimed in claim 28 wherein said physical characteristic is temperature.

30. A method as claimed in claim 29 comprising housing shim material within said gradient coil assembly, and situating said compensating material in thermal contact with said shim material, and electrically heating the shim material and the compensating material.

31. A method as claimed in claim 29 comprising housing shim material in shim slots within said gradient coil assembly, and situating said compensating material within said shim slots, and passing heated fluid through said shim slots.

32. A method as claimed in claim 29 comprising housing shim material in shim slots within said gradient coil assembly, and situating said compensating material is situated within said shim slots, and passing heated fluid through conduits in thermal contact with the shim material and the compensating material.

33. A method as claimed in claim 29 comprising housing shim material contained in shim trays within said gradient coil assembly, and situating said compensating material in a coating on at least one surface of at least one of said shim trays, and heating said coating.

34. A method as claimed in claim 33 comprising embodying said compensating material as a powder in an epoxy resin carrier in said coating.

35. A method as claimed in claim 29 comprising housing shim material contained in shim trays situated within respective shim slots in said gradient coil assembly, and embedding said compensating material as a powder within material forming said shim trays, and heating said compensating material embedded within said material of said shim trays.

36. A method as claimed in claim 28 comprising housing shim material contained in shim trays positioned within shim slots in said gradient coil assembly, and situating said compensating material as at least one patch on a surface selected from the group consisting of a surface of the OVC, a surface of at least one of said shim trays, and a surface of said gradient coil assembly.

37. A method as claimed in claim 36 comprising applying said at least one patch to said surface as a self-adhesive sheet.

38. A method as claimed in claim 28 comprising forming said compensating material as iron-rhodium having a composition $Fe_{(100-x)}Rh_x$, wherein $51 \leq x \leq 60$.

39. A method as claimed in claim 28 comprising forming said compensating material as magnesium bismuth MgBi.

40. A method as claimed in claim 28 comprising forming said compensating material as at least one metal monoxide.

41. A method as claimed in claim 28 comprising forming said compensating material as selected masses of said compensating material, and situating said masses at the bore tube of the OVC at selected locations.

42. A method as claimed in claim 28 comprising situating said compensating material in a coating on a radially outer surface of the bore tube of the OVC.

43. A method as claimed in claim 28 comprising situating said compensating material in a coating on a radially inner surface of the bore tube of the OVC.

44. A method as claimed in claim 28 comprising situating said compensating material in a coating on a radially outer surface of the gradient coil assembly.

45. A method as claimed in claim 28 wherein said compensating material is comprised in a coating on a radially inner surface of the gradient coil assembly.

46. A method as claimed in claim 28 comprising situating said compensating material as a powder in an epoxy resin carrier in a coating on a surface of at least one of said bore tube of said OVC and said gradient coil assembly.

47. A method as claimed in claim 28 wherein said MRI system comprises a complete cylinder of non-magnetic material situated around said gradient coil assembly, embedding said compensating material in said cylinder of non-magnetic material.

48. A method as claimed in claim 28 wherein said MRI system comprises a complete cylinder of non-magnetic material situated inside said bore of said gradient coil assembly as a liner, and embedding said compensating material in said cylinder of non-magnetic material.

49. A method as claimed in claim 28 wherein said MRI system comprises a complete cylinder of non-magnetic material situated around said bore tube of said OVC, and embedding said compensating material in said cylinder of non-magnetic material comprising said compensating material embedded therein.

50. A method as claimed in claim 28 wherein said MRI system comprises a complete cylinder of non-magnetic material situated inside said bore tube of said OVC, and embedding said compensating material in said cylinder of non-magnetic material.

51. A method as claimed in claim 28 wherein said physical characteristic is temperature, and comprising housing shim material contained in shim trays positioned within shim slots in said gradient coil assembly, said shim material being formed as sheets, and wherein said MRI system comprises sheets of non-magnetic material conforming to said sheets of shim material, said sheets of non-magnetic material being situated in said shim trays together with said shim material, and coating said sheets of non-magnetic material with said compensating material or embedding said compensating material in said sheets of non-magnetic material, and heating said sheets of non-magnetic material.

\* \* \* \* \*